(12) United States Patent
Yang et al.

(10) Patent No.: US 9,037,425 B2
(45) Date of Patent: May 19, 2015

(54) METHOD FOR DETERMINING POSITION OF FORCED POWER OSCILLATION DISTURBANCE SOURCE IN REGIONAL INTERCONNECTED POWER GRID

(71) Applicants: STATE GRID CORPORATION OF CHINA, Beijing (CN); WUHAN CENTRAL CHINA ELECTRIC POWER & GRID TECHNOLOGY COMPANY, LTD., Wuhan, Hubei (CN)

(72) Inventors: Dongjun Yang, Hubei (CN); Jisheng Li, Hubei (CN); Jianyong Ding, Hubei (CN); Hanping Xu, Hubei (CN); Chunjian Luo, Hubei (CN)

(73) Assignees: STATE GRID CORPORATION OF CHINA, Beijing (JP); WUHAN CENTRAL CHINA ELECTRIC POWER & GRID TECHNOLOGY COMPANY, LTD., Wuhan, Hubei (CN)

( * ) Notice: Subject to any disclaimer, the term of this patent is extended or adjusted under 35 U.S.C. 154(b) by 0 days.

(21) Appl. No.: 14/282,755

(22) Filed: May 20, 2014

(65) Prior Publication Data
US 2014/0324369 A1    Oct. 30, 2014

Related U.S. Application Data

(63) Continuation of application No. PCT/CN2012/078950, filed on Jul. 20, 2012.

(30) Foreign Application Priority Data

Dec. 1, 2011   (CN) .......................... 2011 1 03905204

(51) Int. Cl.
*G01R 31/08*   (2006.01)
*H02H 7/26*   (2006.01)
*H02J 3/24*   (2006.01)

(52) U.S. Cl.
CPC ................. *G01R 31/086* (2013.01); *H02J 3/24* (2013.01); *Y04S 10/265* (2013.01); *Y02E 60/728* (2013.01); *Y04S 10/522* (2013.01); *H02H 7/261* (2013.01)

(58) Field of Classification Search
CPC .. H02J 2003/007; H02J 3/24; Y02B 70/3225; Y02E 60/728; Y02E 60/74; Y04S 10/265; Y04S 20/222
USPC ...................... 307/102; 702/59; 324/521, 522
See application file for complete search history.

(56) References Cited

U.S. PATENT DOCUMENTS

2009/0240382 A1* 9/2009 Mitani et al. ................... 700/298
2012/0123602 A1* 5/2012 Sun et al. ....................... 700/292

FOREIGN PATENT DOCUMENTS

| CN | 101447676 A | 6/2009 |
| CN | 101593983 A | 12/2009 |

(Continued)

OTHER PUBLICATIONS

State Intellectual Property Office of P. R. China, "First Office Action" for Chinese Application No. 201110390520.4, issued on Jan. 29, 2013, China.

(Continued)

*Primary Examiner* — Mischita Henson
*Assistant Examiner* — Kyle R Quigley
(74) *Attorney, Agent, or Firm* — Tim Tingkang Xia, Esq.; Morris, Manning & Martin, LLP

(57) ABSTRACT

Disclosed is a method for determining a position of a forced power oscillation disturbance source in a regional interconnected power grid. According to the method, when forced power oscillation occurs in a regional power grid, an algebraic sum of energy flow directional factors in the regions of the regional interconnected power grid is calculated so as to online determine the position of the disturbance source in real-time. Compared with the conventional disturbance source positioning method based on an energy function, the disturbance source positioning method based on calculation of the energy flow directional factors provided by the invention can reduce the impact of a periodic disturbance component and an initial constant on the determination of an aperiodic component of branch potential energy, thus achieving higher accuracy. Moreover, the integration links are reduced and the calculation process is simplified, thus better meeting the requirements for real-time power grid calculation.

1 Claim, 2 Drawing Sheets

(56) References Cited

FOREIGN PATENT DOCUMENTS

| CN | 101944776 A | 1/2011 |
|---|---|---|
| CN | 102055201 A | 5/2011 |
| CN | 102062832 A | 5/2011 |
| CN | 102122823 A | 7/2011 |
| CN | 102136733 A | 7/2011 |
| CN | 102170127 A | 8/2011 |
| CN | 102227086 A | 10/2011 |
| CN | 102411118 A | 4/2012 |
| JP | 06230066 A | 8/1994 |

OTHER PUBLICATIONS

Ye Hong-Quan et al., "The Application of Improved Prony Algorithm in the Waveform Analysis of Low Frequency Oscillation in Power System", China Academic Journal Electronic Publishing House, Issue 2, vol. 21, 2008, pp. 1-5, article No. 1006-6519(2008)02-0001-04, Wuhan, Hubei, China.

State Intellectual Property Office of P. R. China, (ISA/CN) "Written Opinion of International Search Authority", for PCT/CN2012/078950, issued on Oct. 4, 2012, China.

State Intellectual Property Office of P. R. China, (ISA/CN) "International Search Report", for PCT/CN2012/078950, issued on Oct. 4, 2012, China.

Ju Ping et al., "Online Identification of Low-Frequency Oscillations Based on Wide-Arer Measurements", Proceedings of the CSEE, vol. 25, No. 22, Nov. 2005, pp. 56-60, article No. 0258-8013 (2005) 22-0056-05, China.

Wei Hu et al., "Disturbance Source Location of Forced Power Oscillation in Regional Power Grid", Power Engineering and Automation Conference (PEAM), p. 363-366, Sep. 8, 2011, China.

State Intellectual Property Office of P. R. China, "Search Report", for Chinese Application No. 2011103905204, Jan. 21, 2013, China.

Yang Dongjun, et al., "Mechanism Analysis of Low-frequency Oscillation Based on WAMS Measured Data", Automation of Electric Power Systems, vol. 33, No. 23, pp. 24-26, Dec. 10, 2009, China.

Yu Yiping, et al., "Disturbance Source Location of Forced Power Oscillation Using Energy Functions", Automation of Electric Power Systems, vol. 34, No. 5, pp. 1-5, Mar. 10, 2010, China.

State Intellectual Property Office of P. R. China, "Notice of Allowance", for Chinese Application No. 201110390520.4, Apr. 28, 2013, China.

Yang Dongjun et al., "A Disturbance Source Location Method for Forced Power Oscillations Based on Parameter Identification", Automation of Electric Power Systems, Jan. 25, 2012, vol. 36, No. 2, pp. 26-30, ISSN 1000-1026, China.

* cited by examiner

METHOD FOR DETERMINING POSITION OF FORCED POWER OSCILLATION DISTURBANCE SOURCE IN REGIONAL INTERCONNECTED POWER GRID

CROSS-REFERENCE TO RELATED APPLICATIONS

This application is a continuation application of International Patent Application No. PCT/CN2012/078950, filed Jul. 20, 2012, entitled "METHOD FOR DETERMINING POSITION OF FORCED POWER OSCILLATION DISTURBANCE SOURCE IN REGIONAL INTERCONNECTED POWER GRID," by Dongjun YANG et al, which itself claims the priority to Chinese Patent Application No. 201110390520.4, filed Dec. 1, 2011 in the State Intellectual Property Office of P.R. China, entitled "METHOD FOR DETERMINING POSITION OF FORCED POWER OSCILLATION DISTURBANCE SOURCE IN REGIONAL INTERCONNECTED POWER GRID," by Dongjun YANG et al, which are hereby incorporated herein in their entireties by reference.

Some references, which may include patents, patent applications and various publications, are cited and discussed in the description of this invention. The citation and/or discussion of such references is provided merely to clarify the description of the present invention and is not an admission that any such reference is "prior art" to the present invention described herein. All references cited and discussed in this specification are incorporated herein by reference in their entireties and to the same extent as if each reference was individually incorporated by reference.

FIELD OF THE INVENTION

The present invention relates generally to safe operation of a power system and grid dispatching automation, and more particularly to a method for determining a position of a forced power oscillation disturbance source in a regional interconnected power grid.

BACKGROUND OF THE INVENTION

The background description provided herein is for the purpose of generally presenting the context of the present invention. Work of the presently named inventors, to the extent it is described in this background section, as well as aspects of the description that may not otherwise qualify as prior art at the time of filing, are neither expressly nor impliedly admitted as prior art against the present invention.

In the case of disturbance, motor rotors in a power system may relatively swing to cause sustained oscillations in the absence of damping, with an oscillation frequency in a range of about 0.1-2.5 Hz, which is thus called low-frequency oscillations. The low-frequency oscillation problem falls into a category of small disturbance stability. Along with expansion of the scale of interconnected power systems, operation of long-distance heavy-load transmission systems and applications of rapid automatic excitation regulators and rapid excitation systems, the low-frequency oscillation problem occurs in many power systems at domestic and abroad. Low-frequency oscillations are one of the important factors that affect safe and stable operation of the power systems.

Forced power oscillations are one type of the low-frequency oscillations, that is, when a frequency of a system suffered from external sustained periodic power disturbance is close to the natural frequency of power oscillations of the system, significant power oscillations occur. Tang Yong, in *Fundamental Theory of Forced Power Oscillation in Power System* published in POWER SYSTEM TECHNOLOGY 2006, 30 (10): 29-33, Yang Dongjun et al., in *Mechanism Analysis of Low-Frequency Oscillation Based on WAMS Measured Data* published in AUTOMATION OF ELECTRIC POWER SYSTEMS 2009, 33 (23): 24-28, and Yang Dongjun et al., in *Analysis of Forced Power Oscillation of Power Systems caused by Asynchronous Connection of Synchronous Generators* published in AUTOMATION OF ELECTRIC POWER SYSTEMS 2011, 35 (10): 99-103, through theories and analysis on practical cases of power grids, demonstrate that the most effective measure for the forced power oscillations is to quickly find and cut-off the disturbance source. However, they do not present a specific method of finding the disturbance sources.

Therefore, a heretofore unaddressed need exists in the art to address the aforementioned deficiencies and inadequacies.

SUMMARY OF THE INVENTION

One of the objectives of the present invention is to provide a method for determining a position of a forced power oscillation disturbance source in a regional interconnected power grid. According to certain embodiments of the method, when forced power oscillations occur in a regional power grid, an algebraic sum of energy flow direction factors of each region in the regional interconnected power grid is calculated, so as to online determine the position of the disturbance source in real time. The method is simple and easy to operate, and upon verification of actual cases, can provide a reference for grid dispatchers to quickly find and remove faults.

In one aspect of the present invention, the method for determining a position of a forced power oscillation disturbance source in a regional interconnected power grid includes, according to amounts of changes in low-frequency oscillation active power and frequency real-time measured for a wide-area measurement system (WAMS), parameter identification is performed through the Prony analysis, an energy flow direction factor of a branch is solved, and the position of the disturbance source is determined.

In certain embodiments, the method includes the following steps:

a. in an alternating current (AC) regional interconnected power grid provided with a wide-area measurement system (WAMS), wherein the AC regional interconnected power grid has M regions and L interregional tie-line branches connecting the M regions, providing a synchronous phasor measurement unit (PMU) at a start node and a terminal node of each tie-line branch;

b. when the WAMS monitors that a dominant oscillation frequency $\omega$, an active power oscillation amplitude $\Delta P_T$ and a sustained cycle number n of oscillations in the power grid all meet low-frequency oscillation alarm thresholds, the WAMS immediately issuing a low-frequency oscillation alarm;

c. after issuing the low-frequency oscillation alarm, the WAMS, by taking n oscillation cycles as one group, continuously delivering data of an active power $\Delta P_m$, a start node frequency $\Delta \omega_m$ and a dominant oscillation frequency $\omega$ of each tie-line branch, where m=1, 2, 3, ..., L;

d. for the received data, performing parameter identification on data of an active power $\Delta P_m$ and a start node frequency $\Delta \omega_m$ of the m-th tie-line branch by taking n oscillation cycles as one group and using Prony analysis, so as to obtain power amplitude $\Delta P_{m12}$, start node frequency oscillation amplitude $\Delta \omega_{m1}$, a power initial phase $\phi_{m1}$ and a frequency oscillation initial phase $\phi_{m2}$ of the m-th tie-line branch in a dominant oscillation frequency ω mode, where m=1, 2, 3, ..., L;

e. substituting $\Delta P_{m12}$, $\Delta \omega_{m1}$, $\phi_{m1}$ and $\phi_{m2}$ results identified through Prony analysis into the following formula:

$$b_m = \frac{1}{2} \cdot \Delta P_{m12} \cdot \Delta \omega_{m1} \cdot \omega_0 \cdot \cos(\varphi_{m1} - \varphi_{m2})$$

to obtain an energy flow direction factor $b_m$ of a start node of the m-th tie-line branch, where m=1, 2, 3, ..., L, $\omega_0$ represents a reference angular frequency, $\omega_0 = 2\pi f_0$, $f_0$ represents a power grid reference frequency; taking a direction along which the power flows out of a node as positive, when the energy flow direction factor $b_m$ is greater than 0, the disturbance source being located in a region where the start node of the m-th tie-line branch is located, and when $b_m$ is less than 0, the disturbance source being located in a region where a terminal node of the m-th tie-line branch is located;

f. calculating an energy flow direction factor of each tie-line branch in each of the M regions, if the start node of the m-th tie-line branch is located in the region, the energy flow direction factor being $b_m$; if the terminal node of the m-th tie-line branch is located in the region, the energy flow direction factor being $-b_m$, where m=1, 2, 3, ..., L;

g. calculating an algebraic sum of energy flow direction factors of each region, a region where the algebraic sum of the energy flow direction factors is the greatest being a region where the disturbance source is located.

Accordingly, the method of the present invention has the following advantages over the conventional method.

1. Compared with the conventional method for positioning a disturbance source based on energy functions, the method of the present invention to position a disturbance source is based on calculation of energy flow direction factors, which reduces influences of periodic disturbance components and initial constants on determination of non-periodic components of branch potential energy, and has higher accuracy.

2. The method of the present invention reduces integral link and simplifies calculation processes, thereby meeting the requirements of real-time computing of power grids.

These and other aspects of the present invention will become apparent from the following description of the preferred embodiment taken in conjunction with the following drawings, although variations and modifications therein is affected without departing from the spirit and scope of the novel concepts of the present invention.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment. The drawings do not limit the present invention to the specific embodiments disclosed and described herein. The drawings are not necessarily to scale, emphasis instead being placed upon clearly illustrating the principles of the invention.

DETAILED DESCRIPTION OF THE INVENTION

Figure 1:
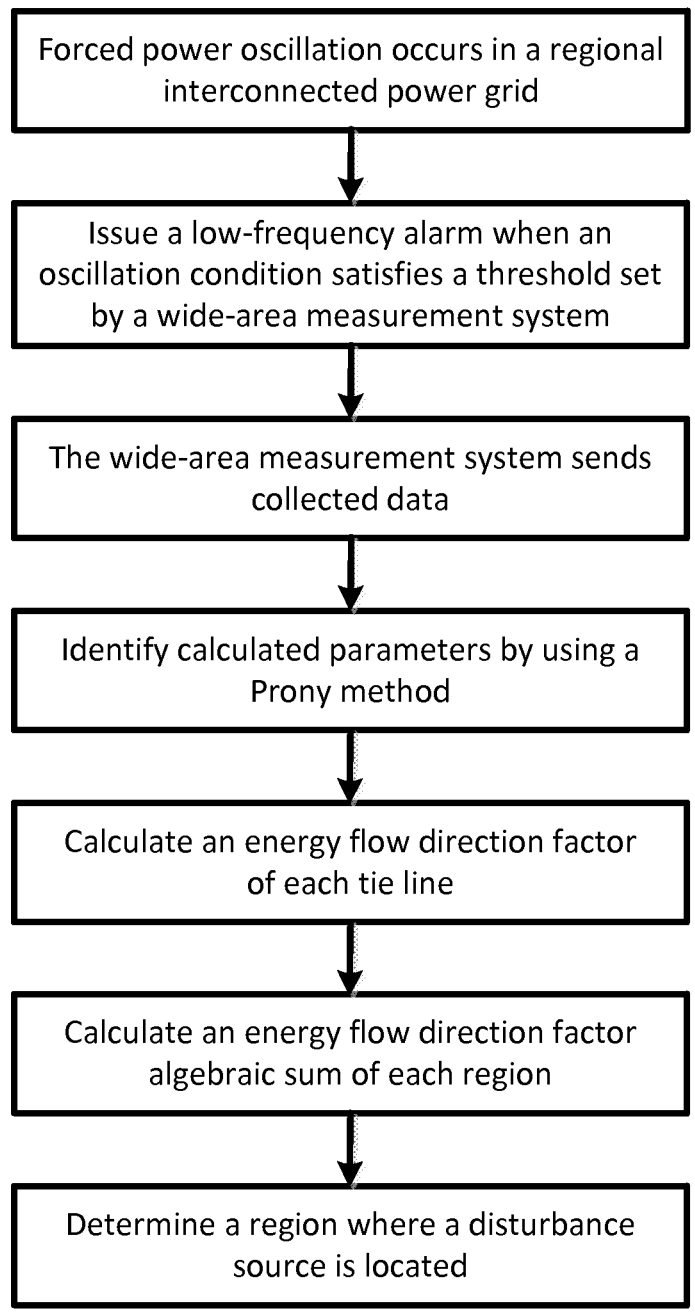
FIG. 1 is a schematic flowchart of a method for determining a position of a forced power oscillation disturbance source in a regional interconnected power grid according to one embodiment of the present invention.

The present invention will now be described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

The terms used in this specification generally have their ordinary meanings in the art, within the context of the present invention, and in the specific context where each term is used. Certain terms that are used to describe the present invention are discussed below, or elsewhere in the specification, to provide additional guidance to the practitioner regarding the description of the present invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the present invention or of any exemplified term. Likewise, the present invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions and/or sections, these elements, components, regions and/or sections should not be limited by these terms. These terms are only used to distinguish one element, component, region or section from another element, component, region or section. Thus, a first element, component, region or section discussed below can be termed a second element, component, region or section without departing from the teachings of the present invention.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

As used herein, "around", "about", "substantially" or "approximately" shall generally mean within 20 percent, preferably within 10 percent, and more preferably within 5 percent of a given value or range. Numerical quantities given herein are approximate, meaning that the terms "around", "about", "substantially" or "approximately" can be inferred if not expressly stated.

As used herein, the terms "comprise" or "comprising", "include" or "including", "carry" or "carrying", "has/have" or "having", "contain" or "containing", "involve" or "involving" and the like are to be understood to be open-ended, i.e., to mean including but not limited to.

The description below is merely illustrative in nature and is in no way intended to limit the present invention, its application, or uses. The broad teachings of the present invention can be implemented in a variety of forms. Therefore, while this disclosure includes particular examples, the true scope of the present invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the present invention.

A wide-area measurement system (WAMS) is formed by a global positioning system (GPS)-based synchronous phasor measurement unit (PMU) and a communication system thereof, is capable of synchronous and high-speed acquisition of active power, reactive power, voltage, current, phase angle and important switching signals of units and operating devices in a wide-area power system, and is a tool that can monitor and analyze the dynamic process of the power system. The WAMS provides new technical means for several aspects, such as grid frequency oscillation monitoring, oscillation event analysis, a oscillation prevention and suppression.

Currently, there are only few studies on the issue of positioning a forced power oscillation disturbance source in a regional interconnected power grid. Yu Yiping et al. in *Positioning of Forced Power Oscillation Disturbance Source based on Energy Functions* published by in AUTOMATION OF ELECTRIC POWER SYSTEMS 2010, 34 (5): 1-6, uses a linear system motion equation to establish an energy function, and the position of the forced power oscillation disturbance source is identified by means of energy conversion characteristics in the system. This publication points out that in a multi-machine system, energy generated by forced power oscillations caused by applied disturbance can be injected into the system only through the unit where the disturbance source is located, and is consumed by damping of each network element in the system, and therefore, the disturbance source can be found according to potential energy changes of the unit where the disturbance source is located and its characteristics different from other units. Because the energy injected into the system through work of the applied disturbance is propagated in the network through potential energy, and potential energy of any node in the system is conserved, that is, the sum of potential energy flowing into a node is equal to the potential energy flowing out of the node, and the potential energy of a generator can be represented with the potential energy of a branch connected therewith. A branch between a node i and a node j in the system is $L_{i\text{-}j}$, and an i-end potential energy function of the branch is:

$$V_{PEi}(t) = \int_0^t \Delta P_{ij} \Delta \dot{\delta}_i \, dt \qquad (1)$$
$$= \int_0^t \Delta P_{ij} \Delta \omega_i \omega_0 \, dt$$

where $\Delta P_{ij}$ represents the amount of change in electric power of the branch $L_{i\text{-}j}$, $\Delta \delta_i$ represents phase angle offset of the node i, $\Delta \omega_i$ represents the amount of change in the branch i-end angular frequency, $\omega_0 = 2\pi f_0$ represents the reference angular frequency, $f_0$ represents the power grid reference frequency, and t represents the disturbance time. According to a calculation result of the branch potential energy function, if the result is greater than 0, disturbance energy of the branch $L_{i\text{-}j}$ flows from the node i to the node j, and the disturbance source is in the direction of the node i; and if the result is less than 0, the disturbance energy of the branch $L_{i\text{-}j}$ flows from the node j to the node i, and the disturbance source is in the direction of the node j. The position of the disturbance source is thus determined. The method can be applied to a multi-machine system. However, the method needs to calculate the branch potential energy function through integration, where the calculation is complicated and is not conducive to real-time computing. In the potential energy function calculation, the position of the disturbance source is mainly determined through non-periodic components, while selection of periodic components and integral initial values in the potential energy function may interfere with accuracy of the determination to some extent.

Because all state quantities change periodically at a disturbance frequency in a steady-state phase of forced oscillations, for a branch m between the node i and the node j in the power grid, suppose that the oscillation power observed at the i end is, $\Delta P_{ij} = \Delta P_{mij} \cdot \cos(\omega t + \phi_1)$, and the oscillation frequency is $\Delta \omega_i = \Delta \omega_{mi} \cdot \cos(\omega t + \phi_2)$, where $\Delta P_{mij}$ and $\Delta \omega_{mi}$ respectively represent amplitudes of changes in the power and the i-end frequency of the branch m; $\phi_1$ and $\phi_2$ represent initial phases of changes in the power and the i-end frequency of the branch m; and ω represents a disturbance frequency; if they are substituted into Equation (1), the potential energy function can be obtained to be:

$$V_{PEi}(t) = \int_0^t \Delta P_{mij} \cdot \cos(\omega t - \varphi_1) \cdot \Delta \omega_{mi} \cdot \cos(\omega t - \varphi_2) \cdot \omega_0 \, dt \quad (2)$$

$$= \frac{1}{4\omega} \cdot \Delta P_{mij} \cdot \Delta \omega_{mi} \cdot \omega_0 \cdot \sin(2\omega t + \varphi_1 + \varphi_2) +$$

$$\frac{1}{2} \cdot \Delta P_{mij} \cdot \Delta \omega_{mi} \cdot \omega_0 \cdot \cos(\varphi_1 - \varphi_2) \cdot t +$$

$$\frac{1}{2} \cdot \Delta P_{mij} \cdot \Delta \omega_{mi} \cdot \omega_0 \cdot \sin(\varphi_1 + \varphi_2)$$

Supposing that:

$$a = \frac{1}{4\omega} \cdot \Delta P_{mij} \cdot \Delta \omega_{mi} \cdot \omega_0 \quad (3)$$

$$b = \frac{1}{2} \cdot \Delta P_{mij} \cdot \Delta \omega_{mi} \cdot \omega_0 \cdot \cos(\varphi_1 - \varphi_2) \quad (4)$$

$$c = \frac{1}{2} \cdot \Delta P_{mij} \cdot \Delta \omega_{mi} \cdot \omega_0 \cdot \sin(\varphi_1 + \varphi_2) \quad (5)$$

then, $$\Delta V_{PEi}(t) = a \cdot \sin(2\omega t + \phi_1 + \phi_2) + b \cdot t + c \quad (6)$$

It can be seen that the potential energy function is formed by superposition of a sine curve whose amplitude is a, frequency is 2ω and initial phase angle is $\phi_1 + \phi_2$ and a straight line whose slope is b. The energy injected into the system through applied disturbance and consumed during propagation in the network is mainly embodied by non-periodic components. It is defined that the potential energy flowing out of the node i is positive and the potential energy flowing into the node i is negative. Because c is an initial constant not changing with time, the direction of the branch potential energy can be determined through the slope b, where when b is greater than 0, the potential energy tends to flow from the node i to the node j, and when b is less than 0, the potential energy tends to flow from the node j to the node i. Therefore, b represents the size and the flowing direction of non-periodic components in the branch potential energy. According to the present invention b is defined as an energy flow direction factor.

Wang Tieqiang et al., in *Study on Validity of Analyzing Low-Frequency Oscillation with Prony Algorithm* published in ELECTRIC POWER 2001, 11 (34): 38-41, demonstrate the validity of the Prony analysis in analysis of low-frequency oscillations of power grids. The Prony analysis based on traces directly performs signal analysis on data waveforms recorded on-site, and considers traces measured actually as linear combinations of some sinusoidal signals (oscillation modes) whose frequencies are fixed and amplitude changes exponentially. The model thereof is expressed as:

$$x(t) = \sum_{i=1}^{n} A_{0i} e^{-\sigma_i t} \cos(\omega_i t + \varphi_{0i}) \quad (7)$$

where n represents the number of oscillation modes; for the i-th oscillation mode, $A_{0i}$ represents oscillation amplitude; a represents a damping factor; $\omega_i$ represents an angular frequency of oscillation; and $\phi_{0i}$ represents an initial phase. The Prony algorithm can be used to perform parameter identification according to active power, node frequency and dominant oscillation frequency data that take n oscillation cycles as one group and obtained through sampling, so as to obtain, through calculation, power amplitude, frequency oscillation amplitude, a power initial phase and a frequency oscillation initial phase in a dominant oscillation frequency mode.

In one aspect of the present invention, a method for determining a position of a forced power oscillation disturbance source in a regional interconnected power grid is provided through the Prony analysis. Specifically, parameter identification is performed through according to amounts of changes in low-frequency oscillation active power and frequency real-time measured for a WAMS, an energy flow direction factor of a branch is solved, and the position of the disturbance source is determined.

Without intent to limit the scope of the present invention, exemplary examples and their related results according to the embodiments of the present invention are given below. Note that titles or subtitles may be used in the examples for convenience of a reader, which in no way should limit the scope of the present invention. Moreover, certain theories are proposed and disclosed herein; however, in no way they, whether they are right or wrong, should limit the scope of the present invention so long as the present invention is practiced according to the present invention without regard for any particular theory or scheme of action.

Embodiment 1

According to the exemplary embodiment, parameter identification is performed through Prony analysis, according to the amount of changes in low-frequency oscillation active power and frequency real-time measured for a WAMS; an energy flow direction factor of a branch is solved according to Equation (4); and a position where a disturbance source is located is then determined. Specifically, the method includes the following steps.

a. In an AC regional interconnected power grid formed by M regions, there are L interregional tie-line branches, suppose that one region has a disturbance source of periodic power oscillation that causes the entire regional interconnected power grid to generate forced power oscillation, at least one end of each interregional tie-line branch is provided with a PMU, and data is synchronously transmitted to a WAMS in a power grid dispatch center.

b. When monitoring that a dominant oscillation frequency co, active power oscillation amplitude $\Delta P_T$ and the sustained cycle number n of oscillation in the power grid all satisfy a low-frequency oscillation alarm threshold, the WAMS immediately issues a low-frequency oscillation alarm.

c. After issuing the low-frequency oscillation alarm, the WAMS, by taking n oscillation cycles as one group, continuously delivers data of an active power, a frequency and a dominant oscillation frequency collected by the WAMS to an analysis program.

Suppose that: a node i and a node j are respectively a start node and a terminal node of a tie-line branche m between two regions, it is necessary to continuously deliver, to a disturbance source location analysis program, data of an active power $\Delta P_{ij}$, an i-end frequency $\Delta \omega_i$ and a dominant oscillation frequency ω in n oscillation cycles of the tie-line branch collected at either end (e.g., i end) of the tie line.

d. The disturbance source location analysis program, by taking n oscillation cycles as one group of data and using Prony analysis, performs parameter identification on data of an active power $\Delta P_{ij}$ and an i-end frequency $\Delta \omega_i$ of the tie-line branch m, so as to obtain tie-line branch power amplitude $\Delta P_{mij}$, i-end frequency oscillation amplitude $\Delta\omega_{mi}$, a branch power initial phase $\phi_1$ and a frequency oscillation initial phase $\phi_2$ in a dominant oscillation frequency $\omega$ mode, and sequentially analyzes data at one end of each tie line.

e. $\Delta P_{mij}$, $\Delta\omega_{mi}$, $\phi_1$ and $\phi_2$ calculation results identified through Prony analysis are substituted into Equation (4) to solve an energy flow direction factor of each tie line. For the tie-line branch m between the node i and the node j, determination is made with i-end measured data, where when the energy flow direction factor b is greater than 0, the disturbance source is located in a region where the node i is located, and when b is less than 0, the disturbance source is located in a region where the node j is located, and an energy flow direction factor $b_m$ of each tie line is calculated.

f. Energy flow direction factors in regions at two ends of one tie line in different regions are calculated. If the measured node i is located in a region I and the peer node j is located in a region J, $b_m^I = b_m$, $b_m^J = b_m$.

g. A regional energy flow direction factor is an algebraic sum of energy flow direction factors in each region, and energy flow direction factors of each region are calculated. For example, there are g tie lines connected to the Ith region (I=1, 2, ... M; g=1, 2, ..., l), the energy flow direction factor of the Ith region is $$b^I = \sum_{m=1}^{g} b_m^I;$$

a region where the algebraic sum of the energy flow direction factors is greatest is a region where the disturbance source is located, for example, the energy flow direction factor of a region E is $b^E = \max\{b^1, b^2, \ldots, b^M\}$. The region E is the region where the disturbance source is located.

Embodiment 2

Figure 2:
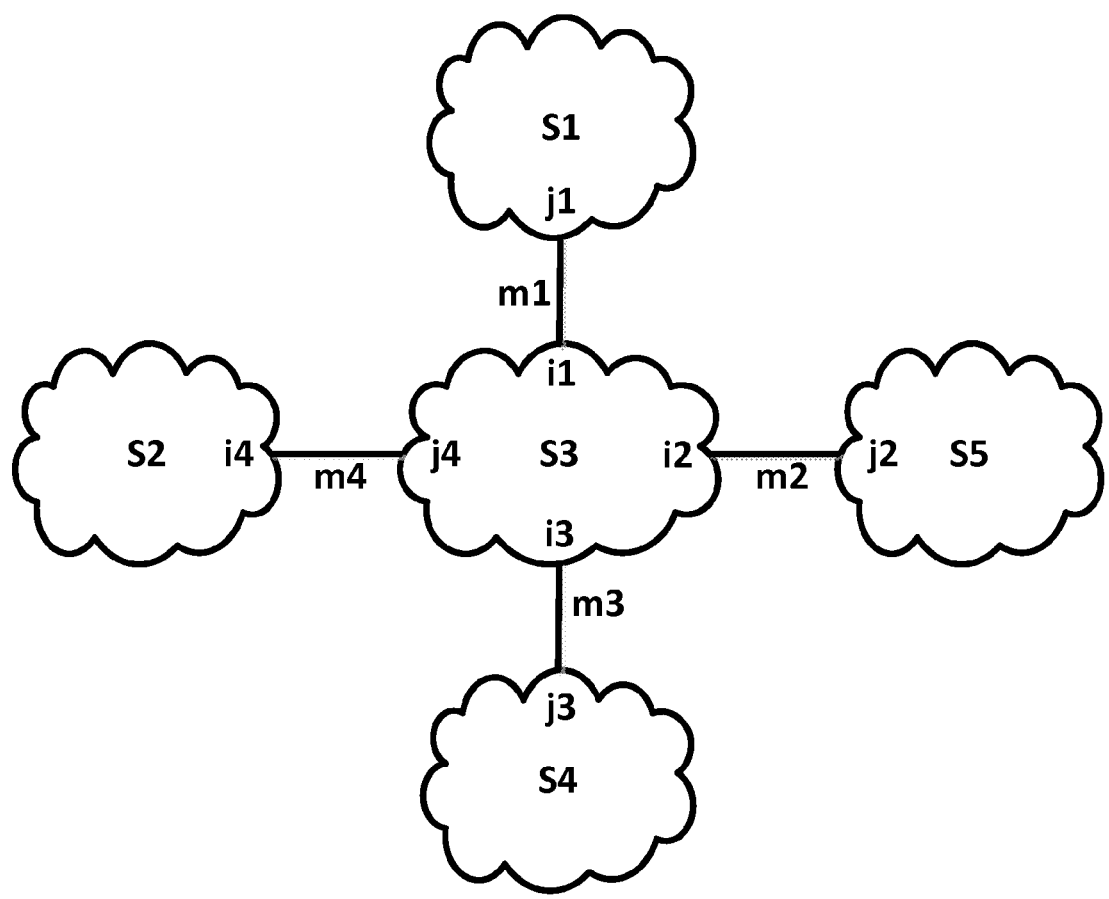
FIG. 2 is a schematic view of a geographic position of a regional interconnected power grid according to one embodiment of the present invention.

The method for determining a position of a forced power oscillation disturbance source in a regional interconnected power grid is provided herewith by using a five-region interconnected power grid shown in FIG. 2 as an example. An actual application process of the present invention is described as follows.

a. An AC interconnected power grid shown in FIG. 2 includes: a total of 5 power supply regions: S1, S2, S3, S4 and S5, where regions S1 and S3, S3 and S5, S3 and S4, as well as S3 and S2 are connected through 4 interregional tie lines: m1, m2, m3 and m4. Nodes at two ends of the tie line m1 are i1 and j1, nodes at two ends of m2 are i2 and j2, nodes at two ends of m3 are i3 and j3, and nodes at two ends of m4 are i4 and j4; where j1 is a node in the region S1, j2 is a node in the region S5, j3 is a node in the region S4, i4 is a node in the region S2, and i1, i2, i3 and j4 are nodes in the region S3. Suppose that the region S1 has a disturbance source of periodic power oscillation with an oscillation frequency of 0.62 Hz that causes the entire regional interconnected power grid to generate forced power oscillation, the nodes i1, i2, i3 and i4 are provided with PMU devices, and after oscillation, data is synchronously transmitted to a WAMS in a power grid dispatch center.

b. Suppose that a low-frequency oscillation threshold of the WAMS needs to simultaneously satisfy the following conditions: a dominant oscillation frequency being 0.1-2.5 Hz, active power oscillation amplitude being 10 MW, and a duration being 5 cycles, and when it is monitored that power oscillation with a dominant frequency of 0.62 Hz occurring in the power grid meets the set threshold, a low-frequency oscillation alarm is issued.

c. After issuing the oscillation alarm, the WAMS delivers, to an analysis program, data of an active power, a frequency and a dominant oscillation frequency $\omega$ of the tie-line branches m1, m2, m3 and m4 collected by the nodes i1, i2, i3 and j4, by taking 5 cycles as one group.

d. The analysis program, by taking 5 oscillation cycles as one group of data, uses Prony analysis to perform parameter identification on the data of the active power and the frequency of the tie lines m1, m2, m3 and m4, so as to obtain tie-line power oscillation amplitude $\Delta P_{mij}$, frequency oscillation amplitude $\Delta\omega_{mi}$, a branch power initial phase $\phi_1$ and a frequency oscillation initial phase $\phi_2$ in a mode of the dominant oscillation frequency of 0.62 Hz.

TABLE 1

Identification results of oscillation parameters of tie lines

| Line Name | $\Delta P_{mij}$ (MW) | $\Delta\omega_{mi}$ (Hz) | $\phi_1$ (°) | $\phi_2$ (°) |
|---|---|---|---|---|
| m1 | 141.82 | 0.018 | −87.64 | 160.07 |
| m2 | 88.81 | 0.008 | 126.84 | 77.19 |
| m3 | 116.64 | 0.006 | 45.20 | 14.65 |
| m4 | 33.49 | 0.002 | −157.14 | 5.21 | e. $\Delta P_{mij}$, $\Delta\omega_{mi}$, $\phi_1$ and $\Delta\omega_2$ calculation results identified through Prony analysis are substituted into Equation (4) to solve an energy flow direction factor b, it is set that the power grid reference frequency $f_0 = 50$ Hz, and the calculation results are as follows.

TABLE 2

Calculation results of energy flow direction factors of tie lines

| Line Name | Name of Energy Flow Direction Factor | Energy flow Direction Factor |
|---|---|---|
| m1 | $b_{m1}$ | −153.34 |
| m2 | $b_{m2}$ | 74.45 |
| m3 | $b_{m3}$ | 101.00 |
| m4 | $b_{m4}$ | −10.78 |

Because wide-area measurement data of the tie lines m1, m2, m3 and m4 are taken from the nodes i1, i2, i3 and j4, the nodes i1, i2 and i3 belong to the region S3, and the node i4 belongs to the region S2, the energy flow direction factor of the tie line m1 $b_{m1} < 0$ indicates that oscillation energy flows from the region S1 to the region S3; $b_{m2} > 0$ indicates that oscillation energy flows from the region S3 to the region S5; $b_{m3} > 0$ indicates that oscillation energy flows from the region S3 to the region S4; and the energy flow direction factor of the tie line m4 $b_{m1} < 0$ indicates that oscillation energy flows from the region S3 to the region S2.

f. Energy flow direction factors in regions at two ends of the tie lines m1, m2, m3 and m4 are calculated in different regions, and calculation results are shown in Table 3.

TABLE 3

Calculation results of energy flow direction factors of tie lines

| Energy Flow Direction Factor of Tie Line | Value |
|---|---|
| $b_{m1}^{S1}$ | 153.34 |
| $b_{m1}^{S3}$ | −153.34 |
| $b_{m2}^{S3}$ | 74.45 |
| $b_{m2}^{S5}$ | −74.45 |

TABLE 3-continued

Calculation results of energy flow direction factors of tie lines

| Energy Flow Direction Factor of Tie Line | Value |
|---|---|
| $b_{m3}^{S3}$ | 101.00 |
| $b_{m3}^{S4}$ | −101.00 |
| $b_{m4}^{S3}$ | 10.78 |
| $b_{m4}^{S2}$ | −10.78 | g. Energy flow direction factors of the regions S1, S2, S3, S4 and S5 are calculated, and calculation results are shown in Table 4.

TABLE 4

Calculation results of regional energy flow direction factors

| Regional Energy Flow Direction Factor | Value |
|---|---|
| $b^{S1}$ | 153.34 |
| $b^{S2}$ | −10.78 |
| $b^{S3}$ | 32.89 |
| $b^{S4}$ | −101.00 |
| $b^{S5}$ | −74.45 |

According to the calculation results, the region S1 is the region where the algebraic sum of the energy flow direction factors is the greatest, that is, the disturbance source is located in the region S1.

The embodiments have proved that the present invention can achieve rapid determination of a position of a forced power oscillation disturbance source in a regional interconnected power grid.

The foregoing description of the exemplary embodiments of the present invention has been presented only for the purposes of illustration and description and is not intended to be exhaustive or to limit the present invention to the precise forms disclosed. Many modifications and variations are possible in light of the above teaching.

The embodiments were chosen and described in order to explain the principles of the present invention and their practical application so as to enable others skilled in the art to utilize the present invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for determining a position of a forced power oscillation disturbance source in a regional interconnected power grid, comprising:

(a) in an alternating current (AC) regional interconnected power grid provided with a wide-area measurement system (WAMS), wherein the AC regional interconnected power grid has M regions and L interregional tie-line branches connecting the M regions, providing a synchronous phasor measurement unit (PMU) at a start node and a terminal node of each tie-line branch;

(b) when the WAMS monitors that a dominant oscillation frequency co, an active power oscillation amplitude $\Delta P_T$ and a sustained cycle number n of oscillations in the power grid all meet low-frequency oscillation alarm thresholds, the WAMS immediately issuing a low-frequency oscillation alarm;

(c) after issuing the low-frequency oscillation alarm, the WAMS, by taking n oscillation cycles as one group, continuously delivering data of an active power $\Delta P_m$, a start node frequency $\Delta \omega_m$ and a dominant oscillation frequency ω of each tie-line branch, wherein m=1, 2, 3, ..., L;

(d) for the received data, performing parameter identification on the data of the active power $\Delta P_m$ and the start node frequency $\Delta \omega_m$ of the m-th tie-line branch by taking n oscillation cycles as one group and using Prony analysis, so as to obtain a power amplitude $\Delta P_{m12}$, a start node frequency oscillation amplitude $\Delta \omega_{m1}$, a power initial phase $\phi_{m1}$ and a frequency oscillation initial phase $\phi_{m2}$ of the m-th tie-line branch in the dominant oscillation frequency ω mode, wherein m=1, 2, 3, ..., L;

(e) substituting $\Delta P_{m12}$, $\Delta \omega_{m1}$, $\phi_{m1}$ and $\phi_{m2}$ identified through the Prony analysis into the following formula:

$$b_m = \frac{1}{2} \cdot \Delta P_{m12} \cdot \Delta \omega_{m1} \cdot \omega_0 \cdot \cos(\varphi_{m1} - \varphi_{m2})$$

to obtain an energy flow direction factor $b_m$ of a start node of the m-th tie-line branch, wherein m=1, 2, 3, ..., L, $\omega_0$ represents a reference angular frequency, $\omega_0 = 2\pi f_0$, $f_0$ represents a power grid reference frequency; taking a direction along which the power flows out of a node as positive, when the energy flow direction factor $b_m$ is greater than 0, the disturbance source being located in a region where the start node of the m-th tie-line branch is located, and when $b_m$ is less than 0, the disturbance source being located in a region where a terminal node of the m-th tie-line branch is located;

(f) calculating an energy flow direction factor of each tie-line branch in each of the M regions, if the start node of the m-th tie-line branch is located in the region, the energy flow direction factor being $b_m$; if the terminal node of the m-th tie-line branch is located in the region, the energy flow direction factor being $-b_m$, wherein m=1, 2, 3, ..., L;

(g) calculating an algebraic sum of energy flow direction factors of each region, a region where the algebraic sum of the energy flow direction factors is the greatest being a region where the disturbance source is located.

* * * * *